United States Patent [19]
Bourget et al.

[11] Patent Number: 5,279,866
[45] Date of Patent: Jan. 18, 1994

[54] PROCESS FOR DEPOSITING WEAR-RESISTANT COATINGS

[75] Inventors: Lawrence Bourget, Winchester; Richard S. Post, Lexington, both of Mass.

[73] Assignee: Applied Science and Technology Inc., Woburn, Mass.

[21] Appl. No.: 75,148

[22] Filed: Jun. 10, 1993

[51] Int. Cl.[5] .............................. B05D 3/06
[52] U.S. Cl. .................. 427/575; 204/192.1; 427/249; 427/255.2; 427/255.3; 427/294; 427/576; 427/577; 427/579
[58] Field of Search ............... 427/575, 576, 577, 579, 427/249, 255.2, 255.3, 294; 204/192.1

Primary Examiner—Bernard Pianalto
Attorney, Agent, or Firm—Joseph S. Iandiorio

[57] ABSTRACT

A process for depositing on a sample surface a smooth, wear-resistant coating including the steps of providing a vacuum processing chamber for holding the sample to be coated, introducing into the processing chamber coating-forming reactants for deposition on the sample surface, and supplying to the processing chamber a plasma stream with an electron temperature of up to 10 eV, a directed ion energy of 5 to 50 eV, and an ion flux at the sample in the range of 0.1 to 100 milliamps per square centimeter for transferring energy to the deposited material to form the smooth coating.

19 Claims, 1 Drawing Sheet

PROCESS FOR DEPOSITING WEAR-RESISTANT COATINGS

FIELD OF INVENTION

This invention relates to a process for depositing wear-resistant coatings using a microwave-generated plasma stream and gaseous supply of the coating components.

BACKGROUND OF INVENTION

There are virtually endless applications for wear-resistant coatings. For example, mechanical parts that are subject to moving contact with other parts will eventually wear to the point that the part must be re-shaped or replaced. Similarly, cutting edges, when dulled, must be resharpened or replaced. Each of these applications would benefit greatly by the use of a wear-resistant coating that is thin enough not to substantially alter the part size, has good adhesion to the substrate so it does not flake or chip in use, and is extremely smooth so that it does not increase the friction of the coated part.

There are additional applications in which wear-resistant coatings would be extremely useful in protecting an underlying part to increase the part life by acting as a barrier layer and a wear-resistant layer. For example, manufactures of plastic eyeglass lenses use lens molds that must be extremely smooth, wear-resistant, and able to easily release the molded lens. Other substrates such as long-life digital recording media compact discs require a coating that is optically transparent, wear-resistant, and will act as a moisture barrier to protect the underlying material containing the encoded information from degradation.

Many processes have been developed to provide wear-resistant coatings for these varied applications. One commonly employed process coats parts with titanium nitride using an ion plating process that employs an intense arc to evaporate the titanium target as titanium ions. The surface to be coated is held near the target at ground so that the titanium ions impact the surface at high energy. Typically, this process takes place in a nitrogen atmosphere for supplying ionized nitrogen that is similarly accelerated into the surface, where it reacts with the titanium ions to form the titanium nitride coating. These coatings, however, are typically smooth to only approximately a few thousand Angstroms and thus are insufficient for applications requiring extremely smooth coatings. In addition, the substrate temperatures of several hundred degrees celsius make these high temperature processes inappropriate for materials with low melting temperatures such as plastics, substrate materials that cannot stand the thermal stress associated with high temperature operation, or substrate-coating combinations that are mismatched in coefficient thermal expansion so that unacceptable stresses are introduced when the part is cooled from the high deposition temperature.

Another coating deposition process employs RF plasma chemical vapor deposition in which two closely spaced electrodes are used to create an electric field between the electrodes in which a plasma is formed. The substrate is placed in or adjacent to the plasma for chemical vapor deposition of coating compounds. This CVD process, however, operates at a high voltage, which would cause sputtering of the substrate surface, resulting in an unacceptably rough surface in any applications requiring an extremely smooth surface. Further, this RF plasma process is not suitable for coating pointed or irregularly-shaped objects, as non-planar surfaces may cause arcing between an electrode and the surface.

Silicon carbide is an extremely hard compound that is a commonly used abrasive which exhibits hardness and wear characteristics superior to many other abrasives. Silicon carbide films have been found to be useful x-ray lithography windows due to the mechanical properties and transparency of the compound. These silicon carbide x-ray lithography windows are typically fabricated by depositing the silicon carbide on a silicon substrate using microwave-energized electron cyclotron resonance (ECR) apparatus. This process typically takes place at a relatively high temperature of approximately 500° C. to 800° C. to create films of low tensile stress so that the window created by etching away part of the silicon substrate from the backside after deposition of the silicon carbide layer is under sufficient tension that it will not buckle.

SUMMARY OF INVENTION

It is therefore an object of this invention to provide a process for depositing extremely smooth wear-resistant coatings.

It is a further object of this invention to provide such a process that operates at relatively low temperature.

It is a further object of this invention to provide such a process that may be used to deposit wear-resistant coatings on low melting point substrates.

It is a further object of this invention to provide such a process that may be used to deposit extremely thin, smooth wear resistant coatings.

It is a further object of this invention to provide such a process for depositing wear-resistant coatings on irregular or sharp-edged surfaces.

It is a further object of this invention to provide such a process that deposits extremely stable films.

This invention results from the realization that extremely smooth, thin layers of silicon carbide may be deposited at low temperature by providing a high density, low energy ion stream to a substrate in a downstream processing chamber and injecting silicon and carbon-containing gases into the chamber for deposition on the substrate, in which the plasma stream imparts sufficient energy to the deposited material to form a very smooth silicon carbide layer.

This invention may consist essentially of a process for depositing on a sample surface a smooth, wear-resistant coating that is typically a carbide, nitride, oxide or oxynitride. Silicon, boron, and other metallic compounds may be deposited. In a preferred embodiment, the coating is silicon carbide. The process includes the steps of providing a vacuum processing chamber for holding the sample to be coated, introducing into the processing chamber coating-forming reactants for deposition on the sample surface, and supplying to the processing chamber a plasma stream with an electron temperature of up to 10 eV, a directed ion energy of 5 to 50 eV, and an ion flux at the sample in the range of 0.1 to 100 milliamps per square centimeter for transferring energy to the deposited material to form the smooth coating. Preferably, the plasma stream is provided from a microwave-energized ECR chamber in which a gas used to create the plasma is provided to the chamber.

The coating-forming reactants may include a source of metal that may be provided in a gaseous form or by sputtering or evaporating a metal source in the processing chamber. The vacuum chamber may include a second vacuum chamber in communication with the processing chamber for receiving the sample to be coated. The additional step of heating the sample before introducing the reactants may be provided for providing a relatively constant-temperature process. This heating may take place in the vacuum lock chamber or in the processing chamber, and it may be accomplished with the plasma stream.

To deposit silicon carbide, the coating-forming reactants may include a silicon compound such as silane and a hydrocarbon such as ethylene.

DISCLOSURE OF PREFERRED EMBODIMENT

Other objects, features and advantages will occur to those skilled in the art from the following description of a preferred embodiment and the accompanying drawings.

BRIEF DESCRIPTION OF THE DRAWING

The FIGURE is a schematic diagram of an apparatus for practicing the process of this invention.

There is shown in the figure microwave plasma ECR deposition apparatus 10 for practicing the process of this invention. Apparatus 10 includes vacuum chamber 16 for holding sample 20 to be coated with a smooth, wear-resistant coating. Sample 20 sits on sample table 18 that may have provision for heating and cooling the sample to maintain a desired operating temperature, or applying an RF bias to the sample so that the it may be cleaned by sputtering before the coating is applied.

Figure 1:
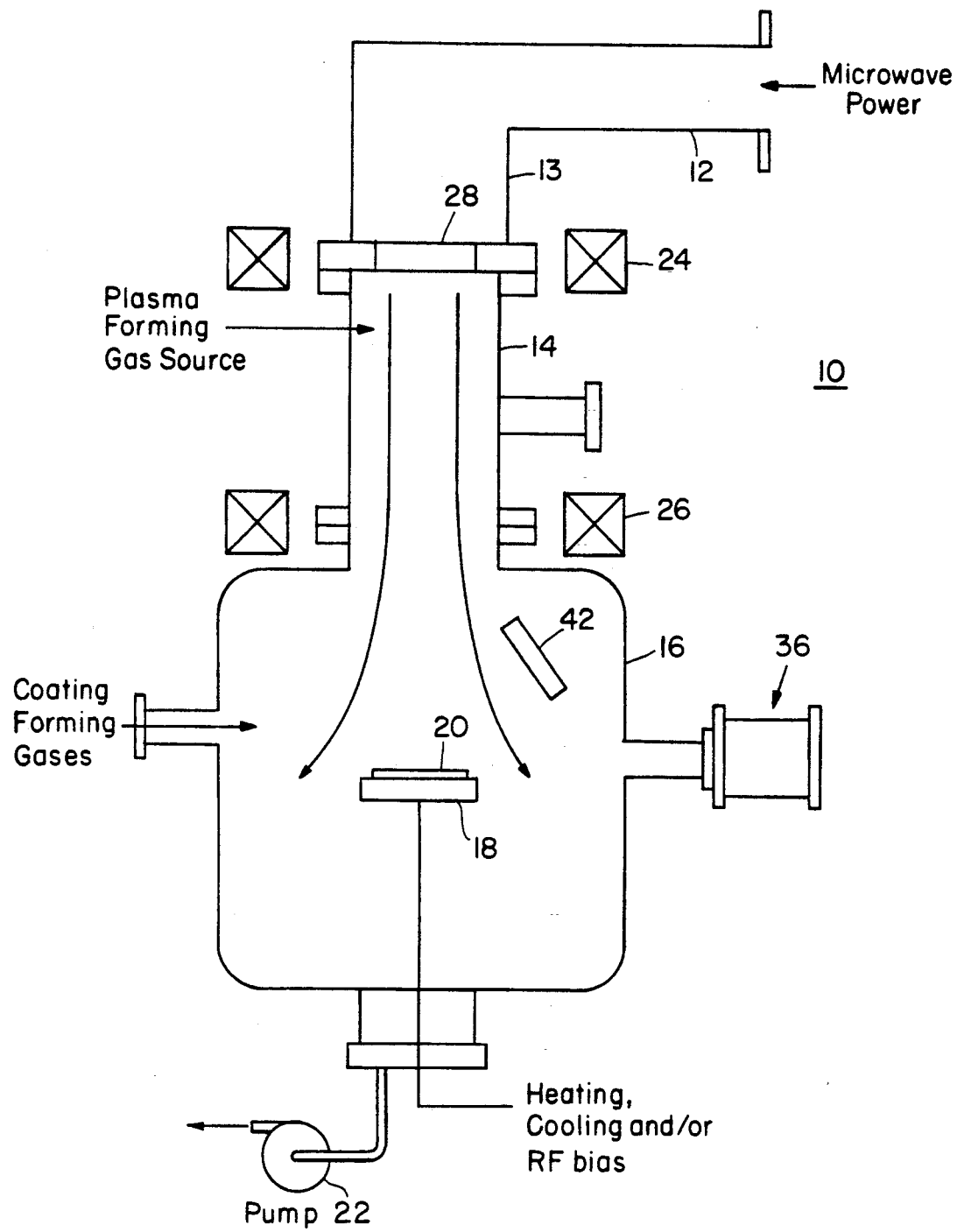

In use, microwave power is supplied in a conventional manner to rectangular waveguide 12 that is coupled preferably using a symmetric coupler to cylindrical waveguide 13, itself coupled to ECR chamber 14. The microwave power enters chamber 14 through microwave-transparent window 28. Annular magnets 24 and 26 are placed around chamber 14 for creating electron cyclotron resonance conditions in chamber 14, and guiding the plasma formed in chamber 14 into processing chamber 16 as stream 31. A gas to be formed into a plasma in chamber 14 is supplied to the chamber at a desired flow rate and pressure. A desired pressure is maintained in processing chamber 16 by the use of vacuum exhaust pump 22. The coating-forming gases, such as silane, are introduced into processing chamber 16. Metal source 42 may alternatively or additionally be sputtered or evaporated in chamber 16 to provide a source of metal for deposition. Second vacuum chamber 36 in communication with chamber 16 can be used as a substrate loading chamber to prevent the introduction of contaminants into chamber 16; the substrate is loaded into chamber 36 and that chamber evacuated before chamber 36 is opened to chamber 16 and the substrate placed in chamber 16.

In order to deposit an extremely smooth coating of wear-resistant material, plasma stream 31 preferably has an electron temperature of up to 10 eV, a directed ion energy of from 5 to 50 eV, and an ion flux at sample 20 in the range of 0.1 to 100 milliamps per square centimeter. The low plasma electron temperature in processing chamber 16 is necessary to properly dissociate and ionize the coating-forming gases introduced into chamber 16 to form the desired radical and ion species to drive the reaction on the surface of the material to be coated.

The ion energy of 5 to 50 eV keeps the plasma energy below the sputtering threshold so that the surface builds slowly from the substrate surface, is not damaged by the ions, and is thus extremely smooth. The ions provide energy to the surface that is well above the thermal threshold for the reaction so that the process may be run at a low temperature and still provide the ability to deposit a surface with a smoothness in the range of 50 Angstroms. The preferred ion flux at the sample in the range of 0.1 to 100 milliamps per square centimeter provides sufficient energy to the substrate surface to assure proper reaction between the coating-forming constituents deposited thereon that results in a reasonable film growth rate, and a uniform, smooth coating with low hydrogen inclusion for providing long term coating stability.

EXAMPLE

Silicon carbide is a compound that has favorable mechanical and optical properties for providing a smooth, wear-resistant coating on varied surfaces. In the deposition of silicon carbide on a steel substrate, argon was used as the plasma forming gas source supplied to ECR chamber 14. A source of silicon and source of carbon were supplied to processing chamber 16 for deposition on the surface of substrate 20. 500 watts of microwave power was used to energize the gas in chamber 14. Annular magnets 24 and 26 were used to produce electron cyclotron resonance conditions in chamber 14 to provide for efficient absorption of the microwave power by the plasma and also to guide the plasma so created along lines 31 toward substrate 20. The plasma electron temperature was held below 10 eV so that it was sufficient to dissociate the coating-forming gases to form the proper radicals; silane and ethylene were used as the coating forming gases with the silane supplied in a silane/argon mixture (for safety reasons) of 10% silane supplied at 80 SCCM. Ethylene was used as the hydrocarbon for providing a carbon source; the ethylene was supplied to chamber 16 at 4.8 SCCM.

In operation, steel sample 20 was cleaned by wiping with acetone and methanol before placement on substrate holder 18. Processing chamber 16 was operated in the millitorr range at approximately 3.5 millitorr by use of pump 22. The system was operated for a time before introduction of the coating-forming gases in chamber 16 to heat sample 20 with the plasma; sample 20 was held at approximately 170° C. during the deposition process.

Plasma 31 dissociated the silane and ethylene into hydrated radical species that deposited on substrate 20. Low energy ion bombardment removes hydrogen and induces sufficient mobility to provide for reaction between the species while the deposition process continued.

The plasma was provided at a directed ion energy of 5 to 50 eV so that the ion energy was sufficient to impart enough energy to the surface to provide mobility to the deposited species so that the reactant layer was extremely smooth and dense, while the energy was held below the sputtering threshold to prevent transfer of too much energy that would tend to remove material through momentum transfer mechanisms. This process resulted in the deposition of from approximately 100 to 200 Angstroms of silicon carbide per minute.

The silicon carbide thin films deposited using this process typically have a Knoop microhardness in the range 1100–1600 kg/mm$^2$ with a 5 gf load. By comparison, uncoated 304 stainless steel has a Knoop microhardness of approximately 300 kg/mm$^2$ when tested under the same 5 gf load.

Pin-on-disk wear tests have shown that silicon carbide films deposited by this process are very wear resistant. Lifetime is greater than 80,000 revolutions under the following conditions:

Load = 20 gf (Hertzian stress of 1550 MPa)
Indenter = 3 mm diameter ruby ball
Rotational Speed = 40 rpm
Translational Speed = 33.5 mm/sec
Wear Track Diameter = 16 mm The deposited film, and films of carbides, nitrides, and oxides with low hydrogen content contain bonding structures that are similar to the bulk materials. The mechanical and optical properties such as density, hardness and index of refraction of the films also approach bulk values as the hydrogen content is lowered. Films with a high hydrogen content are more similar to polymers, which can be quite porous and soft.

The process of this invention is useful for depositing carbides, nitrides, oxides and oxynitrides. Metallic compounds such as titanium nitride may be deposited along with silicon and boron compounds such as silicon oxide, silicon oxynitride and boron nitride. To deposit these coatings, the materials to be deposited on the substrate and which will react thereon to form the desired coating are added to the deposition chamber, typically in gaseous form.

The coatings may be deposited on surfaces subject to wear, such as sliding surfaces and cutting edges. Additional applications include lens molds where the coating protects the integrity of the mold surface and also helps in mold release, and coatings for storage media such as magnetic disks and compact disks, in which the coatings act not only to protect the underlying surface from wear, but also as an optically transparent moisture barrier that can greatly extend the product life.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A process for depositing on a sample surface a smooth, wear-resistant coating, comprising:
   providing a vacuum processing chamber for holding the sample to be coated;
   introducing into said processing chamber coating forming reactants for deposition on the sample surface; and
   supplying to said processing chamber a plasma stream with an electron temperature of up to 10 eV, a directed energy of 5 to 50 eV, and in ion flux at the sample in the range of 0.1 to 100 milliamps per square centimeter for transferring energy to the deposited material to form the smooth coating.

2. The deposition process of claim 1 in which supplying a plasma stream includes providing a microwave-energized ECR chamber.

3. The deposition process of claim 2 in which supplying a plasma stream further includes directing a plasma-forming gas into said ECR chamber.

4. The deposition process of claim 1 in which the coating is taken from the group including carbides, nitrides, oxides and oxynitrides.

5. The deposition process of claim 4 in which the coating is a metallic compound.

6. The deposition process of claim 5 in which the coating forming reactants include a source of metal.

7. The deposition process of claim 6 in which the source of metal is gaseous.

8. The deposition process of claim 6 in which the source of metal includes sputtering a metal into the processing chamber.

9. The deposition process of claim 6 in which the source of metal includes evaporating a metal into the processing chamber.

10. The deposition process of claim 4 in which the coating is a silicon compound.

11. The deposition process of claim 4 in which the coating is a boron compound.

12. The deposition process of claim 4 in which the coating is silicon carbide.

13. The deposition process of claim 12 in which said coating forming reactants include a silicon compound and a hydrocarbon.

14. The deposition process of claim 13 in which said silicon compound is silane.

15. The deposition process of claim 13 in which said hydrocarbon is ethylene.

16. The deposition process of claim 1 in which said vacuum chamber includes a vacuum chamber in communication with said processing chamber for receiving the sample to be coated.

17. The deposition process of claim 1 further including the step of heating the sample before introducing the reactants.

18. The deposition process of claim 1 further including the steps of heating or cooling the sample during deposition.

19. A process for depositing on a sample surface a smooth silicon carbide coating, comprising:
   providing a vacuum processing chamber for holding the sample to be coated;
   introducing into said chamber a gaseous silicon compound and a gaseous hydrocarbon for deposition on the sample surface;
   providing a microwave-energized ECR chamber for creating from a gas a plasma stream with an electron temperature of up to 10 eV and a directed ion energy of 5 to 50 eV; and
   supplying the plasma stream to the sample at an ion flux in the range of 0.1 to 100 milliamps per square centimeter for transferring energy to the deposited material to form the silicon carbide coating on the sample surface.

* * * * *